United States Patent
Kantorovich et al.

(10) Patent No.: US 6,911,827 B2
(45) Date of Patent: Jun. 28, 2005

(54) SYSTEM AND METHOD OF MEASURING LOW IMPEDANCES

(75) Inventors: Isaac Kantorovich, Chestnut Hill, MA (US); Christopher L. Houghton, Westborough, MA (US); Stephen C. Root, Westborough, MA (US); James J. St. Laurent, Oakham, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 152 days.

(21) Appl. No.: 10/274,611

(22) Filed: Oct. 21, 2002

(65) Prior Publication Data

US 2004/0075451 A1 Apr. 22, 2004

(51) Int. Cl.[7] .................... G01R 27/28; G01R 23/16
(52) U.S. Cl. ................ 324/615; 324/76.21; 702/77
(58) Field of Search .................... 324/76.21, 76.22, 324/615, 765, 103, 763; 702/64–77, 124

(56) References Cited

U.S. PATENT DOCUMENTS

| | | | | |
|---|---|---|---|---|
| 4,023,098 A | * | 5/1977 | Roth ................. | 324/76.12 |
| 5,343,404 A | * | 8/1994 | Girgis ................ | 702/72 |
| 5,375,065 A | * | 12/1994 | Owen ................ | 702/124 |
| 5,465,287 A | * | 11/1995 | Egozi ................ | 379/22.02 |
| 5,909,656 A | * | 6/1999 | Yang ................. | 702/77 |
| 5,963,023 A | | 10/1999 | Herrell et al. ......... | 323/265 |
| 6,556,001 B1 | * | 4/2003 | Wiegand et al. ....... | 324/76.21 |
| 6,687,631 B2 | * | 2/2004 | Yoon et al. .......... | 702/76 |
| 6,768,952 B2 | * | 7/2004 | Kantorovich et al. .... | 702/65 |

OTHER PUBLICATIONS

Isaac Kantorovich, et al., "Measurement of Milliohms of Impedance at Hundred MHz on Chip Power Supply Loop," Electrical Performance on Electronic Packaging Conference, Presented on Oct. 23, 2002, 4 pages.

Chris Houghton, et al., "Modeling and Management of the Alpha 21364 Package," Compaq Inspiration Technology, EPEP 2001, Oct. 31, 2001, 29 pages.

(Continued)

*Primary Examiner*—Anjan K. Deb (57) ABSTRACT

A method comprises generating first and second current levels and measuring the first and second current levels. The method further comprises alternately generating the first and second current levels repeatedly to generate a periodic current waveform, and measuring the voltage at at least one port in a system a plurality of times to obtain a plurality of sets of voltage measurements. The plurality of sets of voltage measurements are averaged. The method further comprises alternately generating the first and second current levels repeatedly at a predetermined number of different clock frequencies, determining a Fourier component of the averaged voltage measurements to determine clock frequency-dependent noises, removing the clock frequency-dependent noises to generate a filtered average voltage, and determining an impedance by dividing a Fourier component of the filtered average voltage by a Fourier component of the periodic current waveform having alternating first and second current levels.

28 Claims, 4 Drawing Sheets

OTHER PUBLICATIONS

Sungjun Chun, et al., "Model to Hardware Correlation for Power Distribution Induc d I/O Noise in a Functioning Computer System," Electronic Components & Technology Conference, May 2002, pp. 319–324.

Istvan Novak, "Probes and Setup for Measuring PowerPlane Impedances with Vector Network Analyzer," 1999 High-Performance Systems Design Conference, Feb. 1–4, 1999, pp. 201–215.

Istvan Novak, "Measuring MilliOhms and PicoHenrys In Power–Distribution Networks," 2000 High Performance System Design Conference, Feb. 1–4, 2000, 14 pages.

Kantorovich et al., "Measurement of Millohms of Impedance at Hundred MHz on Chip Power Supply Loop;" IEEE 11th Topical Meeting on Electrical Performance of Electronic; Oct. 21, 2002; pp. 319–322.

Taylor et al., "An Approach to Measuring Power Supply Impedance of Microprocessors;" IEEE 10th Topical Meeting on Electrical Performance of Electronic Packaging (Cat. No. 01TH8565), IEEE 10th Topical Meeting on Electrical Performance of Electronic Packaging, Cambridge, MA, Oct. 29–31, 2001, pp. 211–214.

Swaminathan et al., "Measurement Problems in High–Speed Networks," IEEE Instrumentation and Measurement Technology Conference, Budapest, Hungary, May 21–23, 2001; pp. 1339–1346.

* cited by examiner

SYSTEM AND METHOD OF MEASURING LOW IMPEDANCES

TECHNICAL FIELD OF THE INVENTION

The present invention relates generally to the field of electronic circuits, and in particular to a method of measuring low impedances.

BACKGROUND OF THE INVENTION

Several factors in the development of computer systems and electronic circuits such as microprocessor chips, printed circuit boards, and electronic packaging contribute to the need for lower impedances over a wide bandwidth in the power distribution networks of these systems. Decreasing power supply levels, signal transition times and die sizes, and the steady increase of power supply currents and clock speeds all require the power distribution network to have very low impedance levels. The typical target impedance for computer systems have decreased by a factor of five every two years. Low impedance in the milliohm and sub-milliohm range is desirable to minimize noise generation, electromagnetic radiation and interference.

While techniques to verify signal integrity of high-speed signals have been widely available, the need to accurately measure very low impedances in the milliohm and sub-milliohm ranges at high frequencies remains unsatisfied. Time-domain reflectometry instruments have been used to measure power distribution network impedances. However, time-domain reflectometry measurements are not suitable for measuring milliohm range impedances due to the noise and nonlinearity of the oscilloscope used in this method. RLC (resistance, inductance and capacitance) meters cannot measure sub-ohm impedances at hundreds of megahertz frequencies. Vector network analyzers have also been used to measure circuit parameters, however they can only access exterior points of a semiconductor chip and cannot measure interior impedances. Furthermore, vector network analyzers measure impedance by supplying and forcing a current into the system, but the current cannot be pushed through the circuit uniformly and achieve satisfactory measurements. A common disadvantage of these conventional methodologies also includes the inability to obtain on-die impedance measurement during system operations.

SUMMARY OF THE INVENTION

In accordance with an embodiment of the present invention, a method comprises generating a first current level, measuring the first current level, generating a second current level, and measuring the second current level. The method further comprises alternately generating the first and second current levels repeatedly to generate a generate a periodic current waveform, and measuring the voltage at at least one port in a system a plurality of times to obtain a plurality of sets of voltage measurements. The plurality of sets of voltage measurements are averaged. The method further comprises alternately generating the first and second current levels repeatedly at a predetermined number of different clock frequencies, determining a Fourier component of the averaged voltage measurements to determine clock frequency-dependent noises, removing the clock frequency-dependent noises to generate a filtered average voltage, and determining an impedance by dividing a Fourier component of the filtered average voltage by a Fourier component of the periodic current waveform having alternating first and second current levels.

In accordance with another embodiment of the present invention, a method of determining operating impedance in a system having a microprocessor comprises executing a first plurality of computer instructions in the microprocessor operable to create a high current level in the system, measuring the high current level, executing a second plurality of computer instructions in the microprocessor operable to create a low current level in the system, and measuring the low current level. The method further comprises alternately executing the first plurality of computer instructions and the second plurality of computer instructions repeatedly to generate a periodic current waveform, and measuring the voltage at at least one port in the system a plurality of times to obtain a plurality sets of voltage measurements. The plurality sets of voltage measurements are averaged. The method comprises continually executing the first and second pluralities of computer instructions alternately at a predetermined number of different clock frequencies to determine clock frequency-dependent noises, and removing the clock frequency-dependent noises to generate a filtered average voltage, and determining an impedance as a function of frequency by dividing a Fourier component of the filtered average voltage by a Fourier component of the periodic current waveform having alternating high and low current levels.

In accordance with yet another embodiment of the present invention, a system comprises means for generating a first current level in the system, means for measuring the first current level, means for generating a second current level in the system, means for measuring the second current level, means for alternately generating the first current level and the second current level repeatedly to generate a periodic current waveform, means for measuring the voltage at, given the periodic current waveform, at least one port in the system a plurality of times to obtain a plurality of sets of voltage measurements, means for averaging the plurality of sets of voltage measurements, means for generating the first and second current levels at a predetermined number of different clock frequencies, means for determining a Fourier component of the averaged voltage measurements to determine clock frequency-dependent noises, means for removing the clock frequency-dependent noises to generate a filtered average voltage, and means for determining an impedance by dividing a Fourier component of the filtered average voltage by a Fourier component of the periodic current waveform having alternating first and second current levels.

BRIEF DESCRIPTION OF THE DRAWINGS

For a more complete understanding of the present invention, the objects and advantages thereof, reference is now made to the following descriptions taken in connection with the accompanying drawings in which.

DETAILED DESCRIPTION OF THE INVENTION

The preferred embodiment of the present invention and its advantages are best understood by referring to FIGS. 1 through 6 of the drawings, like numerals being used for like and corresponding parts of the various drawings.

Figure 1:
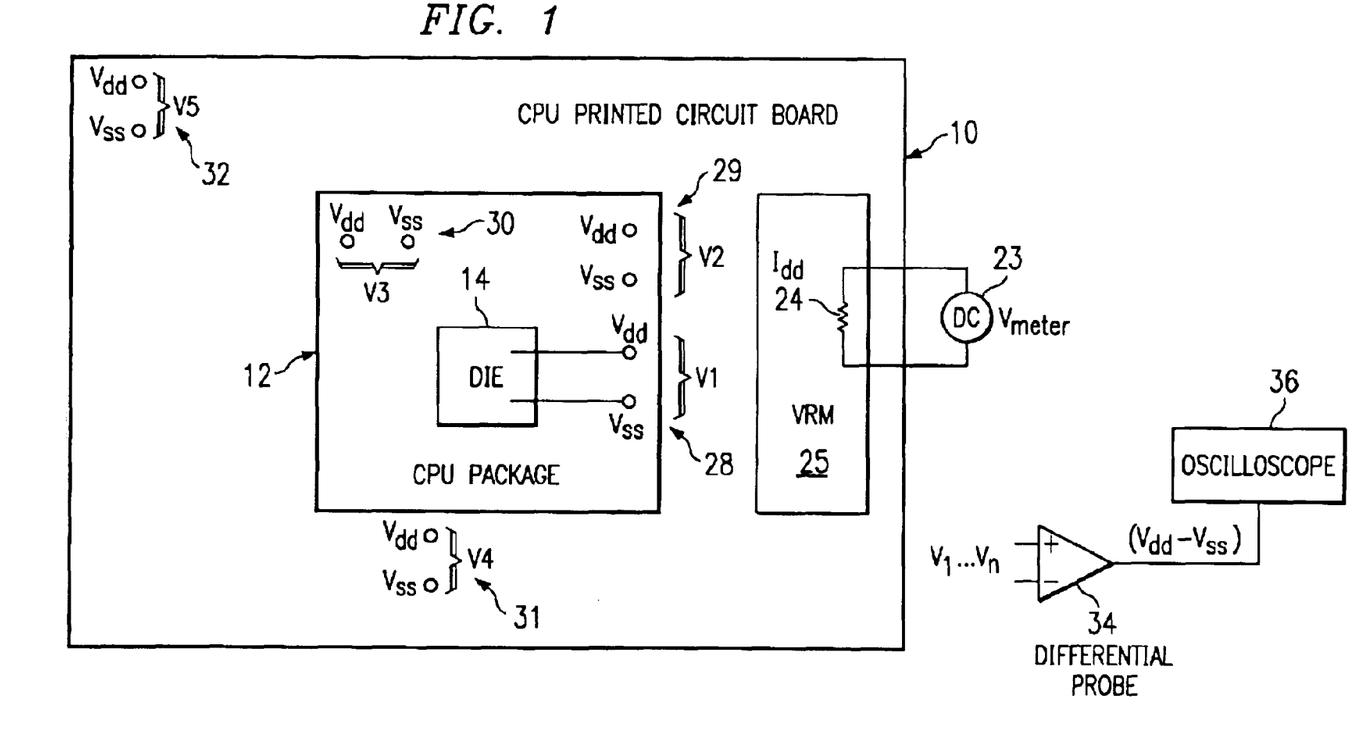
FIG. 1 is a block and schematic diagram of an embodiment of a system of low impedance measurement according to the teachings of the present invention.

FIG. 1 is a block and schematic diagram illustrating an embodiment of a system for measuring low impedance according to the teachings of the present invention. For illustrative purposes, FIG. 1 shows application of a system and method of the present invention to a computer processing unit (CPU) printed circuit board 10, a semiconductor chip package 12 residing on printed circuit board 10, and a semiconductor die 14 inside package 12. Ohm's law, expressed by the following is used for solving for impedance (Z) as a function of frequency:

$$Z(f) = \frac{F_f(V(t))}{F_f(I(t))}$$

where $F_f(g(t))$ is the Fourier component of function $g(t)$ at frequency f, V is voltage, I is current, and t is time. Voltage as a function of time can be accurately measured, but it is very difficult to measure variations of current at the same time. Embodiments of the present invention accomplish this task by generating a current with controllable and known features within the frequency range of interest. The generated current has a simple waveform to avoid introducing additional noise into the measurements.

Three computer algorithms operable to generate a periodic current during microprocessor operations are provided for use during impedance measurements. The current has a simple waveform such as a step or trapezoidal waveform. The computer algorithms each comprise a series of computer instructions. The first algorithm is the HOT code, which comprises a predetermined number of computer instructions, such as four integer addition assembly language instructions, to generate high power. Other computer instructions may also be used, such as integer subtraction, and logical operations such as AND, OR, NOR, XOR, etc. The second algorithm is the COLD code, which comprises a predetermined number of computer operations, such as four integer no-op assembly language instructions, to generate low power. The HOT and COLD codes produce two different constant current levels when executed, where the HOT code generates a higher current than the COLD code. The HOT and COLD codes can be combined alternatively and continuously to create a THROB code. The width of transition between HOT and COLD determines the high frequency boundary of measured impedance. Preferably, the HOT and COLD codes reside in the instruction cache of the microprocessor ready for immediate execution to avoid stalling introduced by fetching instructions. Further, it is desirable to have sufficiently long durations of HOT and then sufficiently long alternate COLD periods to reduce the low frequency boundary. This may be accomplished by introducing loops in the code.

Figure 2:
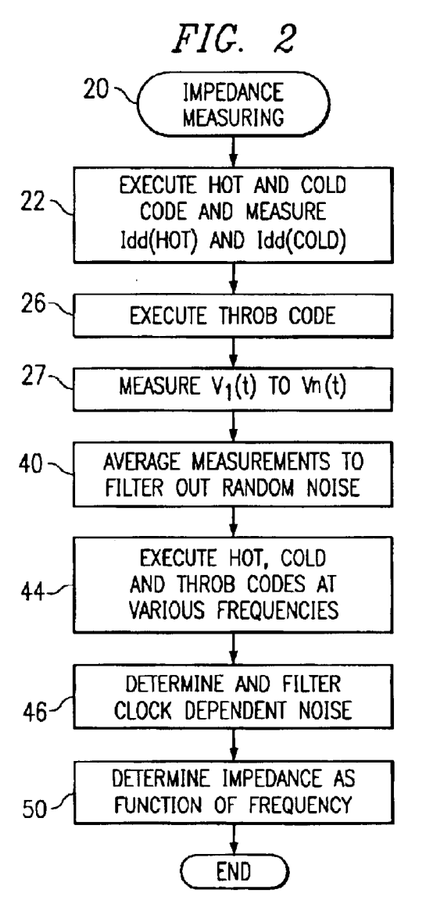
FIG. 2 is a flowchart of an embodiment of low impedance measurement according to the teachings of the present invention.

Referring to FIG. 2 for a flowchart of an embodiment of a process for measuring low impedance 20 according to the teachings of the present invention, the HOT code is executed to generate a steady power level so that $I_{dd}$(HOT) can be measured, and execute the COLD code to generate a steady minimum power level so that $I_{dd}$(COLD) can be measured, as shown in block 22 in FIG. 2. $I_{dd}$(HOT) and $I_{dd}$(COLD) may be determined by using a voltmeter 23 coupled to a sense resistor 24 of a voltage regulator module (VRM) 25 located on printed circuit board 10 to measure the voltage drop across resistor 24. In blocks 26 and 27, a THROB code that alternate predetermined lengths of HOT and COLD periods is then executed, and a plurality of voltage measurements, $V_1(t), V_2(t), \ldots V_n(t)$ between $V_{dd}$ and $V_{ss}$ (power and ground) pads 28–32 located on semiconductor die 14, chip packaging 12 and printed circuit board 10. $V_1(t), V_2(t), \ldots V_n(t)$ are also referred to as measured voltage drop at ports 1 through port n below. Voltage $V_1(t)$ at port 1 is a measurement of on-chip voltage drop and is measured by using dedicated test pads specifically provided on-chip for $V_{dd}$-$V_{ss}$ sensing. These test pads are operable to connect with an instrument such as a high-impedance active differential probe 34. The voltage measurements are made with an oscilloscope 36, for example, coupled to differential probe 34.

Figure 5:
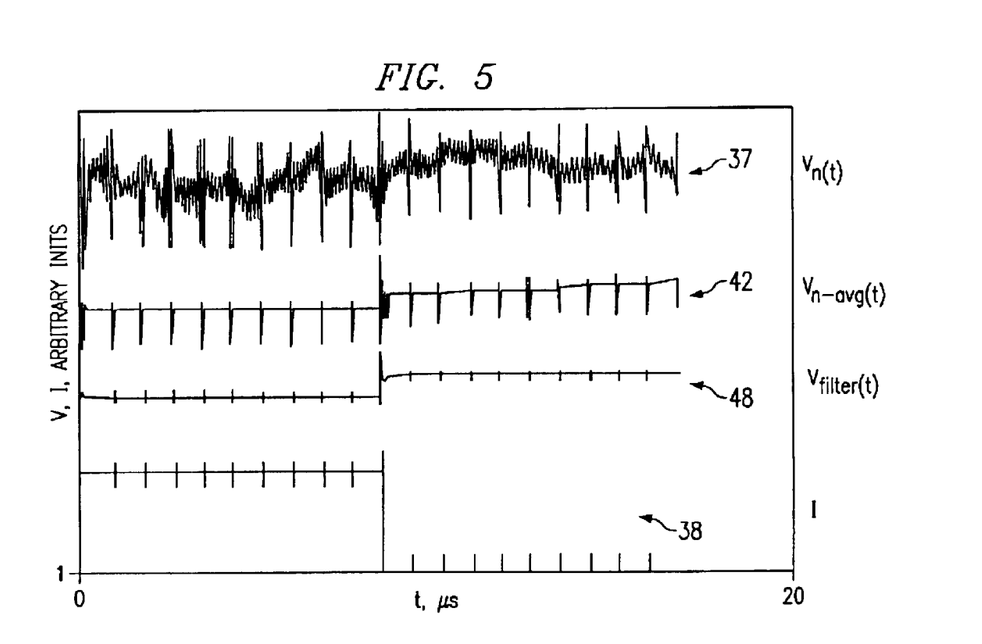
FIG. 5 is a plot of voltage and predicted current and voltage waveforms generated by an embodiment of the COLD, HOT and THROB algorithms according to the teachings of the present invention.

Referring briefly to FIG. 5, an exemplary waveform 37 for $V_1(t)$ is shown. In a preferred embodiment, the THROB code provides a HOT and COLD waveform 38 at a 50% duty cycle and approximately twenty microsecond (μs) period, as shown in FIG. 5. A long-term average math function, provided by oscilloscope 36, is used to average a large number of measurements to reduce random noise, as shown in block 40. An exemplary averaged voltage waveform 42, the result of averaging over 25,000 oscilloscope sweeps, is shown in FIG. 5. Random noise typically originates from sources in the operating environment of the system and is usually arbitrary and aperiodic.

Figure 6:
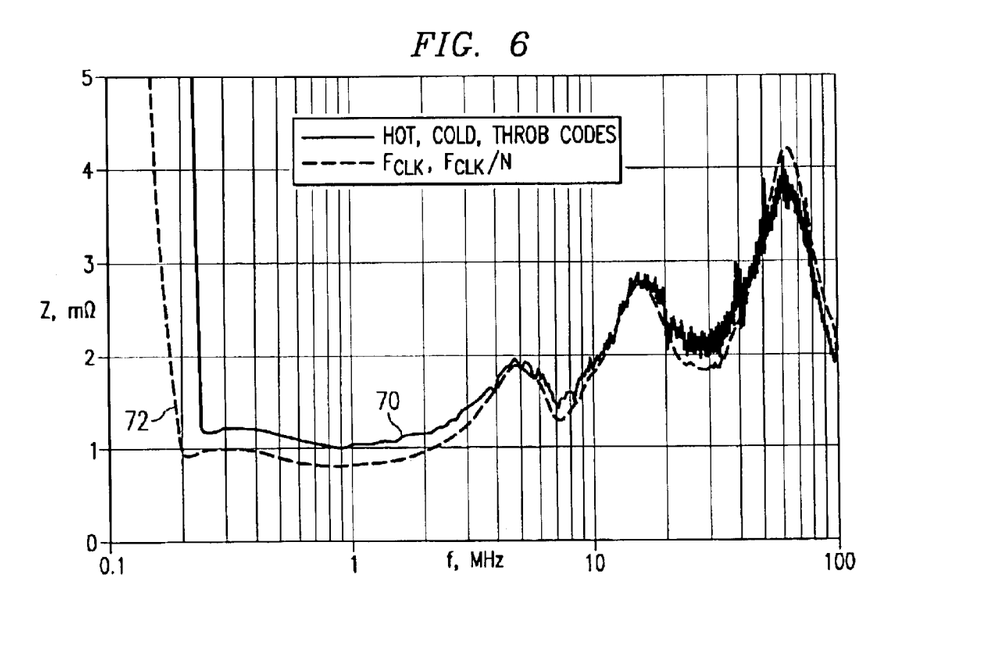
FIG. 6 is a plot of impedance calculations generated by embodiments of the present invention.

Returning to FIG. 2, in block 44, the HOT, COLD, and THROB codes are continuously executed as shown in blocks 22 through 40 at different clock frequencies to measure the currents and voltages at those clock frequencies. By applying Fast Fourier Transform (FFT) to obtain the Fourier component of the measured voltage waveform, the periodic noise that varies with changing clock frequencies can be isolated. This clock-dependent noise is then filtered from the averaged voltage measurements, as shown in block 46. The small periodic spikes in the waveform are caused by loop branching in the code. An exemplary filtered average voltage waveform 48 is shown in FIG. 5. In block 50 of FIG. 2, the impedance, $Z_{1i}$ (where I=1 to n), is determined by:

$$Z_{In}(f) = \frac{F_f(V(t))}{F_f(I(t))}$$

Where $F_f$ is the Fourier component of the voltage or current, and $Z_{11}$ is the impedance of the microprocessor's power supply loop, $Z_{12}$ is the transfer impedance for port 2 on electronic package while the current is predicted for port 1, $Z_{13}$ is the transfer impedance for port 3 on electronic package while the current is predicted for port 1, etc. An exemplary impedance waveform 52 obtained using HOT, COLD and THROB codes over a frequency range of interest is shown in FIG. 6.

It is preferable to provide a number of different THROB codes with different periods to cover a wide frequency range. Step or trapezoidal waveform of larger periods improves measurement accuracy at lower frequencies, and smaller periods improve accuracy at higher frequencies.

Figure 3:
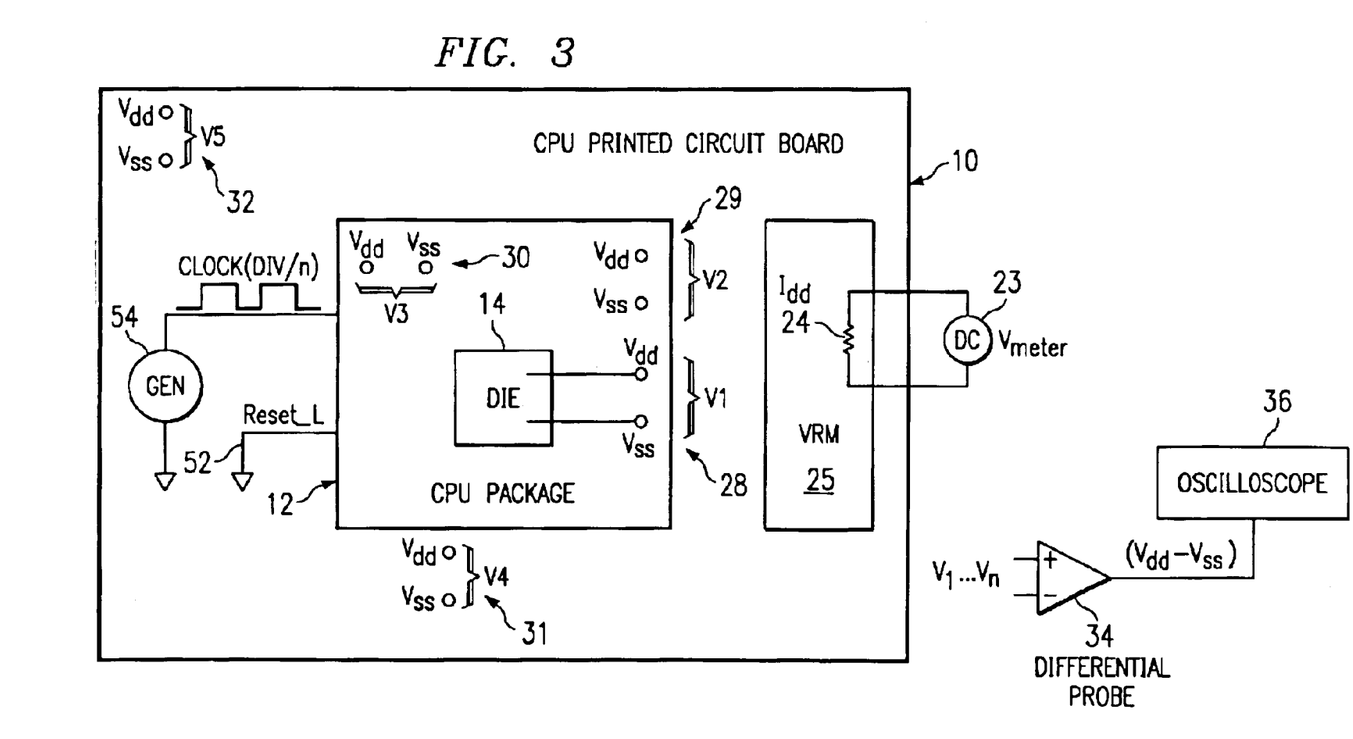
FIG. 3 is a block and schematic diagram of another embodiment of a system of low impedance measurement according to the teachings of the present invention.

FIG. 3 is a block and schematic diagram showing another embodiment of a system of low impedance measurement according to the teachings of the present invention. Rather than using computer codes HOT, COLD and THROB to generate a trapezoidal periodic current waveform, the built-in "divide-by-N" operating mode of the microprocessor chip is used to generate the requisite waveform. The microprocessor is put in reset mode by holding its reset line 52 low while the clock frequency is provided at $F_{CLK}$ or $F_{CLK}/N$, where $F_{CLK}$ is dependent on the microprocessor's operating range, and N is a positive integer. The divide-by-N operating mode is accessible by using the on-chip phase-locked loop (PLL) test mode that normally occurs during the system power up sequence. The period of the trapezoidal current waveform is preferably controlled by using an external pulse generator 54 that provides a waveform at a predetermined duty cycle, such as 50%.

Figure 4:
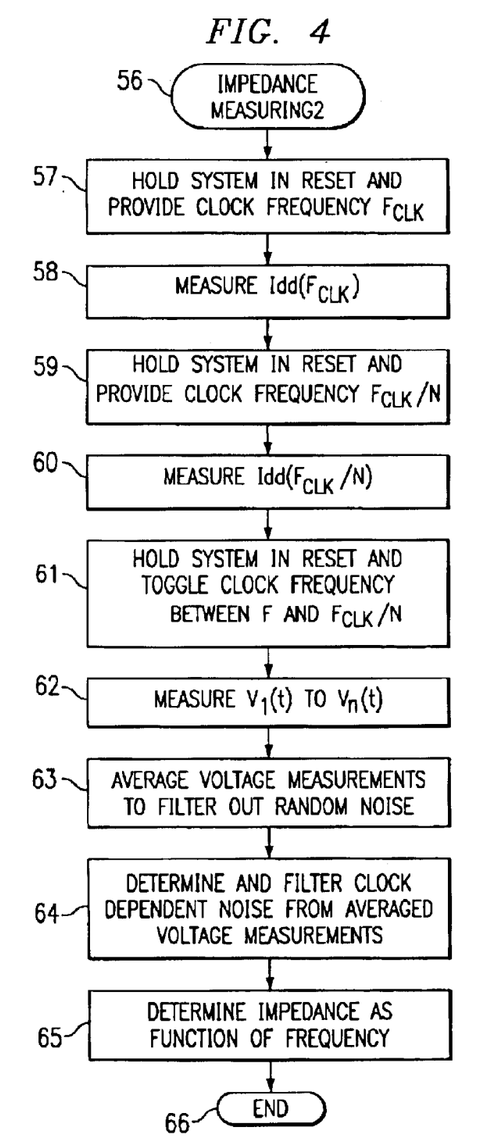
FIG. 4 is a flowchart of another embodiment of low impedance measurement according to the teachings of the present invention.

Referring to FIG. 4 for a flowchart of a second embodiment of a low impedance measurement process 56 according to the teachings of the present invention. In blocks 57 and 58, the system is held at reset and the clock frequency is set at $F_{CLK}$ while the $I_{dd}$ current is measured. The system is again held at reset, but the clock frequency is set at $F_{CLK}/N$ while the $I_{dd}$ is again measured, as shown in blocks 59 and 60. The $I_{dd}$ currents at $F_{CLK}$ and $F_{CLK}/N$ and the rise and fall times determine the current waveform over time, I(t). In block 62, the system is again held at reset while the clock frequency is toggled between $F_{CLK}$ and $F_{CLK}/N$. Using oscilloscope 36, a plurality of voltages, $V_1$ to $V_n$, are measured from various test pads 28–32 on semiconductor die 14, packaging 12, and printed circuit board 10, as shown in block 63. The periodic current waveform rise time may be determined by the Fourier transform of the voltage response to the current generated in the divide-by-N mode, and the inverse rise time or the fall time corresponds to the frequency of the minimum of the Fourier transform.

A long-term average math function, provided by oscilloscope 36, is then used to reduce random noise, as shown in block 64. In order to properly filter out random noise, a large number of oscilloscope sweeps are used in the averaging function. Random noise typically originates from sources in the operating environment of the system, and is arbitrary and aperiodic.

Thereafter in block 65, the voltage measurements are obtained at different clock frequencies. By applying Fast Fourier Transform (FFT) to obtain the Fourier component of the measured voltage waveforms at various clock frequencies, the periodic noise that varies with clock frequency can be isolated. For example, the clock frequency can be varied from 1 megahertz (MHz) to 1 gigahertz (GHz). The clock-dependent noise is filtered from the averaged voltage waveform. In block 66, the impedance, $Z_{1i}$ (where I=1 to n), is determined by:

$$Z_{In}(f) = \frac{F_f(V(t))}{F_f(I(t))}$$

Where $F_f$ is the Fourier component of the voltage or current, and $Z_{11}$ is the impedance of the microprocessor's power supply loop, $Z_{12}$ is the transfer impedance for port 2 on electronic package while the current is predicted for port 1, $Z_{13}$ is the transfer impedance for port 3 on electronic package while the current is predicted for port 1, etc. An exemplary impedance waveform 70 obtained using the frequency-divided-by-N methodology over a frequency range of interest is shown in FIG. 6.

An advantage of current excitation using the divide-by-N methodology over the computer codes includes the elimination of additional noise to the measurements. One of ordinary skill in the art will appreciate that there are noises introduced by the underlying operating system or other sub-components of the system when the microprocessor is operating. Further, the computer codes themselves introduce additional noise that may distort the shape of the current waveform. To avoid random noises associated with the clock, operating system or measuring instrument, a long-term averaging of the voltage waveform using the oscilloscope is desirable, which triggers on the sharp edges of the trapezoidal waveform.

The various embodiments of the present invention described herein provide systems and methods of measuring very low impedances of power supply loops over a wide frequency range at various points on a semiconductor die, in electronic chip packaging, and on a printed circuit board.

What is claimed is:

1. A method of measuring impedance in a system having a microprocessor, comprising:
   generating a first current level in the system via operation of the microprocessor;
   measuring the first current level;
   generating a second current level in the system via operation of the microprocessor;
   measuring the second current level;
   alternately generating the first current level and the second current level repeatedly via operation of the microprocessor to generate a periodic current waveform;
   measuring the voltage at, given the periodic current waveform, at least one port in the system a plurality of times to obtain a plurality of sets of voltage measurements;
   averaging the plurality of sets of voltage measurements;
   generating the first and second current levels at a predetermined number of different clock frequencies;
   determining a Fourier component of the averaged voltage measurements to determine clock frequency-dependent noises;
   removing the clock frequency-dependent noises to generate a filtered average voltage; and
   determining an impedance of a power supply system on the microprocessor by dividing a Fourier component of the filtered average voltage by a Fourier component of the periodic current waveform having alternating first and second current levels.

2. The method, as set forth in claim 1, wherein generating a first current level comprises executing a first plurality of computer instructions in the microprocessor of the system operable to create the first current level in the system.

3. The method, as set forth in claim 2, wherein the first plurality of computer instructions comprises a plurality of instructions operable to generate high power.

4. The method, as set forth in claim 1, wherein generating a second current level comprises executing a second plurality of computer instructions in the microprocessor of the system operable to create the second current level in the system.

5. The method, as set forth in claim 4, wherein the second plurality of computer instructions comprises a plurality of instructions operable to generate low power.

6. The method, as set forth in claim 1, wherein alternately generating the first and second current levels repeatedly comprises alternately executing a first plurality of computer instructions and a second plurality of computer instructions repeatedly.

7. The method, as set forth in claim 1, wherein measuring the first and second current levels comprises measuring respective voltage drops on a sense resistor in a voltage regulator in the system.

8. The method, as set forth in claim 1, wherein the at least one port comprises power and ground pads located on a semiconductor die of the microprocessor, a packaging of the microprocessor, and a printed circuit board of the system.

9. The method, as set forth in claim 1, wherein determining an impedance comprises determining the impedance using:

$$Z(f) = \frac{F_f(V(t))}{F_f(I(t))}$$

where Ff(g(t)) is the Fourier component of function g(t) at frequency f, V is voltage, I is current, and t is time.

10. A method of determining operating impedance in a system having a microprocessor, comprising:
- executing a first plurality of computer instructions in the microprocessor operable to create a high current level in the system, and measuring the high current level;
- executing a second plurality of computer instructions in the microprocessor operable to create a low current level in the system, and measuring the low current level;
- alternately executing the first plurality of computer instructions and the second plurality of computer instructions repeatedly to generate a periodic current waveform, and measuring the voltage at at least one port in the system a plurality of times to obtain a plurality sets of voltage measurements;
- averaging the plurality sets of voltage measurements;
- continually executing the first and second pluralities of computer instructions alternately at a predetermined number of different clock frequencies to determine clock frequency-dependent noises, and removing the clock frequency-dependent noises to generate a filtered average voltage; and
- determining an impedance of power supply system on the microprocessor as a function of frequency by dividing a Fourier component of the filtered average voltage by a Fourier component of the periodic current waveform having alternating first and second current levels.

11. The method, as set forth in claim 10, wherein measuring the high and low currents comprises measuring respective voltage drops on a sense resistor in a voltage regulator in the system.

12. The method, as set forth in claim 10, wherein the at least one port comprises power and ground pads located on a semiconductor die of the microprocessor, a packaging of the microprocessor, and a printed circuit board of the system.

13. The method, as set forth in claim 10, wherein determining an impedance comprises determining the impedance using:

$$Z(f) = \frac{F_f(V(t))}{F_f(I(t))}$$

where Ff(g(t)) is the Fourier component of function g(t) at frequency f, V is voltage, I is current, and t is time.

14. The method, as set forth in claim 10, wherein the first plurality of computer instructions comprises a plurality of instructions in assembly language.

15. The method, as set forth in claim 10, wherein the first plurality of computer instructions comprises a plurality of loops of four integer addition instructions in assembly language.

16. The method, as set forth in claim 10, wherein the second plurality of computer instructions comprises a plurality of instructions in assembly language.

17. The method, as set forth in claim 10, wherein the second plurality of computer instructions comprises a plurality of loops of four integer no-op instructions in assembly language.

18. A system comprising:
- means for generating a first current level in the system via operation of a microprocessor;
- means for measuring the first current level;
- means for generating a second current level in the system via operation of the microprocessor;
- means for measuring the second current level;
- means for alternately generating the first current level and the second current level repeatedly via operation of the microprocessor to generate a periodic current waveform;
- means for measuring the voltage at, given the periodic current waveform, at least one port in the system a plurality of times to obtain a plurality of sets of voltage measurements;
- means for averaging the plurality of sets of voltage measurements;
- means for generating the first and second current levels at a predetermined number of different clock frequencies;
- means for determining a Fourier component of the averaged voltage measurements to determine clock frequency-dependent noises;
- means for removing the clock frequency-dependent noises to generate a filtered average voltage; and
- means for determining an impedance of a power supply system on the microprocessor by dividing a Fourier component of the filtered average voltage by a Fourier component of the periodic current waveform having alternating first and second current levels.

19. The system, as set forth in claim 18, wherein means for generating a first current level comprises the microprocessor executing a first plurality of computer instructions operable to create the first current level in the system.

20. The system, as set forth in claim 19, wherein means for executing the first plurality of computer instructions comprises means for executing a plurality of instructions operable to generate a high current level.

21. The system, as set forth in claim 19, wherein means for executing the first plurality of computer instructions comprises means for executing a plurality of loops of four integer addition instructions in assembly language.

22. The system, as set forth in claim 18, wherein means for generating a first current level comprises the microprocessor executing a second plurality of computer instructions operable to create the current level in the system.

23. The system, as set forth in claim 22, wherein means for executing the second plurality of computer instructions comprises means for executing a plurality of instructions operable to generate a low current level.

24. The system, as set forth in claim 22, wherein means for executing the second plurality of computer instructions comprises means for executing a plurality of loops of four integer no-op instructions in assembly language.

25. The system, as set forth in claim 18, wherein means for alternately generating the first and second current levels repeatedly comprises the microprocessor alternately executing a first plurality of computer instructions and a second plurality of computer instructions repeatedly.

26. The system, as set forth in claim 18, wherein means for measuring the first and second current levels comprises means for measuring respective voltage drops on a sense resistor in a voltage regulator in the system.

27. The system, as set forth in claim 18, wherein means for measuring the first and second current levels comprises means for measuring respective voltage drops on a sense resistor in a voltage regulator in the system.

28. The system, as set forth in claim 18, wherein determining an impedance comprises determining the impedance using:

$$Z(f) = \frac{F_f(V(t))}{F_f(I(t))}$$

where Ff(g(t)) is the Fourier component of function g(t) at frequency f, V is voltage, I is current, and t is time.

* * * * *

UNITED STATES PATENT AND TRADEMARK OFFICE
CERTIFICATE OF CORRECTION

PATENT NO.         : 6,911,827 B2
APPLICATION NO.    : 10/274611
DATED              : June 28, 2005
INVENTOR(S)        : Isaac Kantorovich et al.

It is certified that error appears in the above-identified patent and that said Letters Patent is hereby corrected as shown below:

In column 7, line 38, in Claim 10, after "of" insert -- a --.

Signed and Sealed this

Twenty-first Day of July, 2009

JOHN DOLL
*Acting Director of the United States Patent and Trademark Office*